United States Patent
Jeong et al.

(10) Patent No.: US 9,103,858 B2
(45) Date of Patent: Aug. 11, 2015

(54) CAPACITANCE SENSING APPARATUS AND TOUCH SCREEN APPARATUS

(71) Applicant: SAMSUNG ELECTRO-MECHANICS CO., LTD., Suwon (KR)

(72) Inventors: Moon Suk Jeong, Suwon (KR); Byeong Hak Jo, Suwon (KR); Kyung Hee Hong, Suwon (KR); Yong Il Kwon, Suwon (KR); Tah Joon Park, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 248 days.

(21) Appl. No.: 13/668,999

(22) Filed: Nov. 5, 2012

(65) Prior Publication Data

US 2014/0035862 A1    Feb. 6, 2014

(30) Foreign Application Priority Data

Jul. 31, 2012    (KR) .......................... 10-2012-0084154

(51) Int. Cl.
  *G01R 27/26*    (2006.01)
  *G06F 3/045*    (2006.01)

(52) U.S. Cl.
  CPC ............... *G01R 27/26* (2013.01); *G06F 3/045* (2013.01)

(58) Field of Classification Search
  CPC ............................ G06F 3/044; G01R 27/2605

USPC .................................................. 345/173–174
See application file for complete search history.

(56) References Cited

U.S. PATENT DOCUMENTS

| 2011/0163768 | A1 | 7/2011 | Kwon et al. |
| 2011/0273400 | A1* | 11/2011 | Kwon et al. .................. 345/174 |
| 2012/0161846 | A1* | 6/2012 | Ningrat .......................... 327/365 |
| 2013/0257786 | A1* | 10/2013 | Brown et al. ................. 345/174 |

FOREIGN PATENT DOCUMENTS

| KR | 10-2003-0077232 A | 10/2003 |
| KR | 1020030077232 A | * 10/2004 ............. G01R 27/26 |
| KR | 10-2011-0126026 A | 11/2011 |
| KR | 10-2011-0126028 | 11/2011 |

OTHER PUBLICATIONS

Korean Office Action mailed Nov. 11, 2013 in corresponding Korean Patent Application No. 10-2012-0084154.

* cited by examiner

*Primary Examiner* — Jonathan Horner
*Assistant Examiner* — Douglas M Wilson (57) ABSTRACT

There is provided a capacitance sensing apparatus including a driving circuit unit applying a driving signal to a first capacitor at a predetermined interval; and a sensing circuit unit sensing a change in capacitance generated by the first capacitor based on the driving signal, in which a portion of a plurality of switches included in the sensing circuit unit operate at a first interval, the same as the interval of the driving signal, and remaining switches among the plurality of switches operate at a second interval, different from the first interval.

12 Claims, 6 Drawing Sheets

CAPACITANCE SENSING APPARATUS AND TOUCH SCREEN APPARATUS

CROSS-REFERENCE TO RELATED APPLICATIONS

This application claims the priority of Korean Patent Application No. 10-2012-0084154 filed on Jul. 31, 2012, in the Korean Intellectual Property Office, the disclosure of which is incorporated herein by reference.

BACKGROUND OF THE INVENTION

1. Field of the Invention

The present invention relates to a capacitance sensing apparatus and a touch screen apparatus.

2. Description of the Related Art

A touch sensing device such as a touch screen, a touch pad, or the like is an input device mounted on a display apparatus, allowing a user to intuitively input data. Recently, touch sensing devices have been widely used in various electronic devices such as portable phones, personal digital assistants (PDA), navigation devices, and the like. In particular, recently, as demand for smart phones has increased, a touch screen has been increasingly used as a touch sensing device for providing various input methods within a limited form factor.

Touch screens used in portable devices are classified as resistive-type touch screens and capacitance-type touch screens, according to a method of sensing a touch input. Among these, capacitance-type touch screens have relatively longer lifetimes and are advantageous in allowing for various input methods and easily recognizing various gestures, and thus have increasingly been used. In particular, since a multi-touch interface may be easily implemented in capacitance-type touch screens, as compared with resistive-type touch screens, capacitance-type touch screens are widely used in devices such as smart phones.

Capacitance-type touch screens include a plurality of electrodes having a predetermined pattern, and a plurality of nodes, in which a change in capacitance is generated by a touch input, are defined by the plurality of electrodes. In a plurality of nodes distributed on a two-dimensional (2D) plane, a change in self-capacitance or mutual-capacitance is generated by a touch input, and a weighted average calculation method or the like is applied to the change in capacitance generated in the nodes so as to obtain coordinates of the touch input. In order to obtain accurate coordinates of the touch input, technologies for accurately detecting a change in capacitance generated by the touch input are required. However, when electrical noise is generated in a wireless communications module, a display apparatus, and the like, electric noise may impede accuracy of sensing a change in capacitance.

RELATED ART DOCUMENT (Patent Document 1) US Patent Laid-Open Publication No. 2011/0163768
(Patent Document 2) Korean Patent Laid-Open Publication No. 2011-0126028

SUMMARY OF THE INVENTION

An aspect of the present invention provides a method of minimizing noise when noise influences a change in capacitance to be measured.

Another aspect of the present invention provide a capacitance sensing apparatus and a touch screen apparatus, in which a switch included in a driving circuit unit and a switch included in a buffer end may operate at different cycle times, and output voltages of a first integration circuit unit and a second integration circuit unit included in the buffer end may have positive and negative potentials based on a common voltage, respectively, thereby offsetting introduced noise.

According to an aspect of the present invention, there is provided a capacitance sensing apparatus, including: a driving circuit unit applying a driving signal having a predetermined cycle to a first capacitor; and a sensing circuit unit sensing a change in capacitance generated in the first capacitor based on the driving signal, wherein a portion of a plurality of switches included in the sensing circuit unit operate at a first cycle, the same as the cycle of the driving signal, and remaining switches among the plurality of switches operate at a second cycle, different from the first cycle.

The sensing circuit unit may include a first operational amplifier having an inverting terminal connected to a first switch; and a second operational amplifier having an inverting terminal connected to a second switch, and the first switch and the second switch may operate at the second cycle and operate at different turn-on timings.

The sensing circuit unit may include a third switch formed between an output terminal and the inverting terminal of the first operational amplifier; and a fourth switch formed between an output terminal and the inverting terminal of the second operational amplifier, and the third switch and the fourth switch operate at the first cycle and operate at different turn-on timings.

The sensing circuit unit may include a third operational amplifier having an inverting terminal connected to an output terminal of the first operational amplifier and a non-inverting terminal connected to an output terminal of the second operational amplifier.

The sensing circuit unit may include a fourth operational amplifier, and fifth and sixth switches formed between an output terminal of the third operational amplifier and an inverting terminal of the fourth operational amplifier, and the fifth and sixth switches may operate at the second cycle and operate at different turn-on timings.

The sensing circuit unit may include a second capacitor formed between the third operational amplifier and the fifth and sixth switches, and the second capacitor may be charged and discharged according to an output voltage of the third operational amplifier.

The second interval may be twice as long as the first interval.

According to another aspect of the present invention, there is provided a touch screen apparatus, including a panel unit including a plurality of driving electrodes and a plurality of sensing electrodes; a driving circuit unit applying driving signals to the plurality of driving electrodes, respectively; a sensing circuit unit sensing changes in capacitance generated in intersections between the plurality of sensing electrodes and the driving electrodes to which the driving signals are applied; and a controller controlling operations of the driving circuit unit and the sensing circuit unit, wherein a portion of a plurality of switches included in the sensing circuit unit operate at a first cycle, the same as the cycle of the driving signals, and remaining switches among the plurality of switches operate at a second cycle, different from the first cycle.

The controller may determine at least one of coordinates of a touch input applied to the panel unit, a gesture based on the touch input, and the number of touch inputs provided, from an output signal of the sensing circuit unit.

The sensing circuit unit may include a first operational amplifier having an inverting terminal connected to a first switch; and a second operational amplifier having an inverting terminal connected to a second switch, and the first switch and the second switch may operate at the second cycle and operate at different turn-on timings.

The sensing circuit unit may include a third switch formed between an output terminal and the inverting terminal of the first operational amplifier; and a fourth switch formed between an output terminal and the inverting terminal of the second operational amplifier, and the third switch and the fourth switch may operate at the first cycle and operate at different turn-on timings.

The sensing circuit unit may include a third operational amplifier calculating and outputting a difference between an output voltage of the first operational amplifier and an output voltage of the second operational amplifier.

The sensing circuit unit may include a fourth operational amplifier, and fifth and sixth switches formed between an output terminal of the third operational amplifier and an inverting terminal of the fourth operational amplifier, and the fifth and sixth switches may operate at the second cycle and operate at different turn-on timings.

The first cycle may be a cycle equal to a half of the second cycle.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
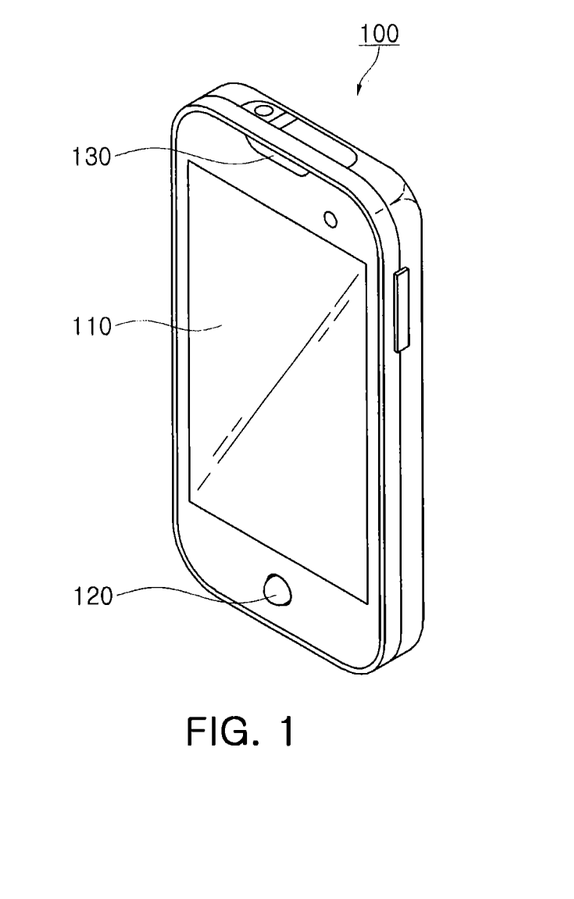
FIG. 1 is a perspective view of an exterior of an electronic apparatus including a touch screen apparatus according to an embodiment of the present invention.

FIG. 1 is a perspective view of an exterior of an electronic apparatus including a touch screen apparatus according to an embodiment of the present invention.

Referring to FIG. 1, an electronic apparatus 100 according to the embodiment of the present invention may include a display device 110 for outputting an image, an input unit 120, an audio unit 130 for outputting a sound, and so on, and may be integrated with the display device 110 to provide the touch screen apparatus.

As shown in FIG. 1, in general, a mobile device may be configured in such a manner that a touch screen apparatus is integrated with a display device, and the touch screen apparatus may have a high degree of light transmissivity to which an image passes through a screen displayed on the display device. Thus, the touch screen apparatus may be manufactured by forming a sensing electrode on a base substrate formed of a transparent film material such as polyethylene terephthalate (PET), polycarbonate (PC), polyethersulfone (PES), polyimide (PI) or the like and the sensing electrode is formed of an electrically conductive material such as indium-tin oxide (ITO), indium zinc oxide (IZO), zinc oxide (ZnO), carbon nanotubes (CNT), or graphene. A wiring pattern connected to the sensing electrode formed of a transparent conductive material is formed in a bezel region of the display device. Since the wiring pattern is visually shielded by the bezel region, the wiring pattern may also be formed of a metal such as silver (Ag), copper (Cu), or the like.

Since it is assumed that the touch screen apparatus according to the embodiment of the present invention operates in a capacitive manner, the touch screen apparatus may include a plurality of electrodes having a predetermined pattern. In addition, the touch screen apparatus includes a capacitance sensing apparatus for sensing a change in capacitance generated in the plurality of electrodes. Hereinafter, with reference to FIGS. 2 through 4, a method and an apparatus for sensing capacitance according to the embodiments of the invention will be described.

Figure 2:
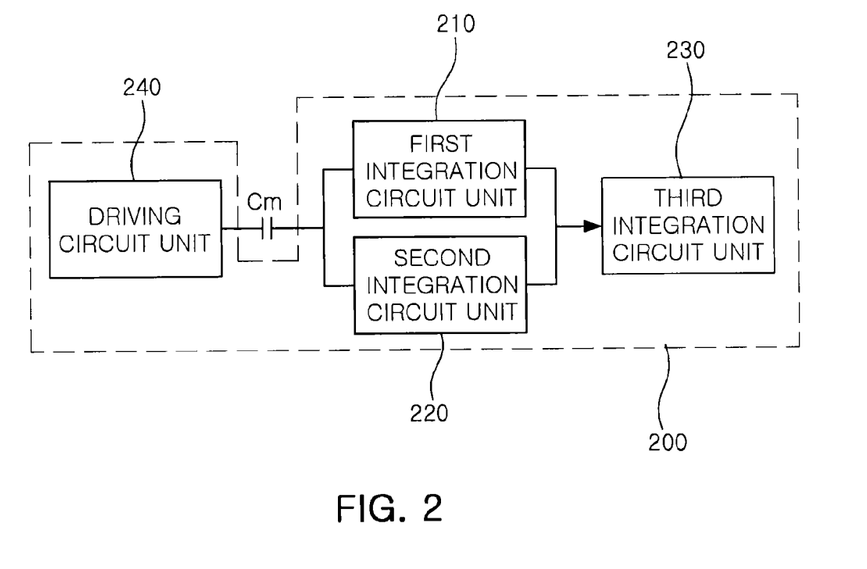
FIG. 2 is a block diagram of a capacitance sensing apparatus according to an embodiment of the present invention.

FIG. 2 is a block diagram of a capacitance sensing apparatus according to an embodiment of the present invention.

Referring to FIG. 2, a capacitance sensing apparatus 200 according to the embodiment of the present invention may include a driving circuit unit 240, a first integration circuit unit 210, a second integration circuit unit 220, and a third integration circuit unit 230. The first, second, and third integration circuit units 210, 220, and 230 may be included in a single sensing circuit unit. A capacitor Cm in which a change in capacitance to be measured, is generated may be connected between the driving circuit unit 240, and the first integration circuit unit 210 and the second integration circuit unit 220.

In FIG. 2, the capacitor Cm is a capacitor charged with capacitance that is to be measured by the capacitance sensing apparatus 200. For example, the capacitor Cm may be a capacitor charged with mutual-capacitance generated between a plurality of electrodes included in a capacitance-type touch screen. Hereinafter, for the convenience of description, it is assumed that the capacitance sensing apparatus 200 according to the embodiment senses a change in capacitance generated in a capacitance-type touch screen. In this case, it may be assumed that the capacitor Cm is a node capacitor charged or discharged according to a change in mutual-capacitance generated in intersections between a plurality of electrodes.

The driving circuit unit 240 generates a predetermined driving signal to allow the capacitor Cm to be charged with electrical charges and provides the driving signal to the capacitor Cm. The driving signal may be a square wave signal having a pulse shape and may have a predetermined frequency. Each of the first integration circuit unit 210 and the second integration circuit unit 220 may include at least one capacitor. The capacitors of the first integration circuit unit 210 and the second integration circuit unit 220 are supplied with the electrical charges charged in the capacitor Cm to be charged or discharged. The first integration circuit unit 210 and the second integration circuit unit 220 generate an output voltage corresponding to the amount of the electrical charges charged in or discharged from the capacitors of the first integration circuit unit 210 and the second integration circuit unit 220. That is, the output voltage of the first integration circuit unit 210 and the second integration circuit unit 220 may be determined according to capacitance of the capacitor Cm, capacitance of the capacitors of the first integration circuit unit 210 and the second integration circuit unit 220, a voltage level of the driving signal, and the like.

The third integration circuit unit 230 includes at least one capacitor. The capacitor of the third integration circuit unit 230 is supplied with the electrical charges charged in the capacitors of the first integration circuit unit 210 and the second integration circuit unit 220 to be charged or discharged. The third integration circuit unit 230 generates an output voltage corresponding to the amount of the electrical charges charged in or discharged from the capacitor of the third integration circuit unit 230. The first integration circuit unit 210, the second integration circuit unit 220, and the third integration circuit unit 230 may include a plurality of switches. In addition, operations of the first, second, and third integration circuit units 210, 220, and 230 may be controlled by controlling operations of the switches.

Figure 3:
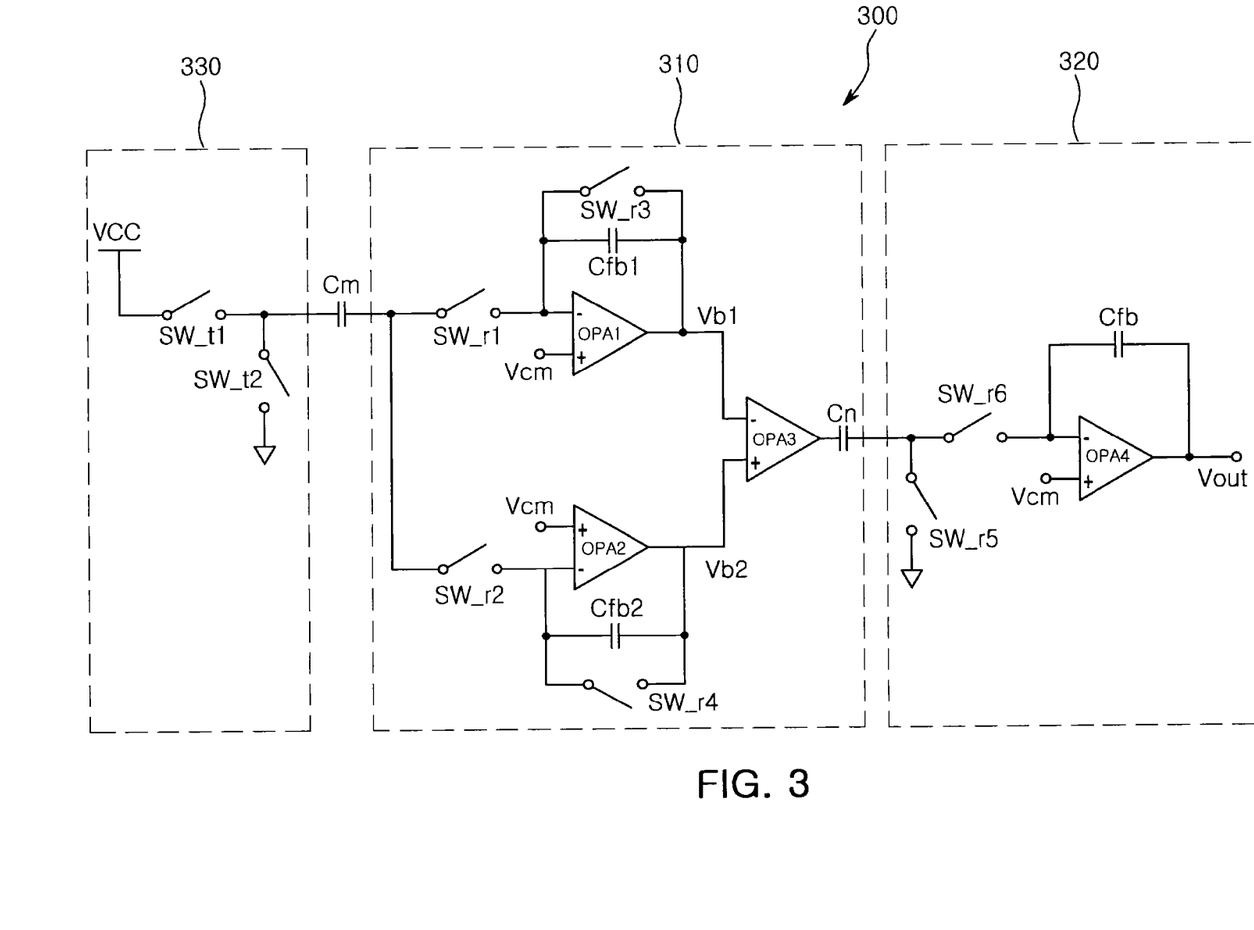
FIG. 3 is a circuit diagram of a capacitance sensing apparatus according to another embodiment of the present invention.

FIG. 3 is a circuit diagram of a capacitance sensing apparatus according to another embodiment of the present invention.

Referring to FIG. 3, a capacitance sensing apparatus 300 according to the present embodiment may include a driving circuit unit 330, a buffer end 310 including a first integration circuit unit and a second integration circuit unit, and a third integration circuit unit 320. With reference to FIG. 3, a detailed operation of the capacitance sensing apparatus 300 according to the present embodiment will be described. As in FIG. 2, the capacitor Cm may be a node capacitor of a capacitance type touch screen.

The driving circuit unit 330 includes two switches, that is, a switch SW_t1 and a switch SW_t2. The switch SW_t1 is connected to a node for supplying a voltage VCC and a first node of the capacitor Cm. The switch SW_t2 is connected to a node for supplying a common voltage Vcm and the first node of the capacitor Cm. When the switch SW_t1 is turned on (in a closed state), the capacitor Cm is charged with electrical charges by the voltage VCC. When the switch SW_t2 is turned on, the electrical charges charged in the capacitor Cm are discharged therefrom. As a result, the switches SW_t1 and SW_t2 may operate at the same cycle but may operate at different turn-on timings.

The buffer end 310 is connected to a second node of the capacitor Cm. The buffer end 310 may include the first integration circuit unit, the second integration circuit unit, a switch SW_r1, a switch SW_r2, an operational amplifier OPA3, and a capacitor Cm. The switch SW_r1 and the switch SW_r2 may be connected to the second node of the capacitor Cm and may be connected to the first integration circuit unit and the second integration circuit unit, respectively.

The first integration circuit unit may include an operational amplifier OPA1 connected to a second node of the switch SW_r1, and a switch SW_r3 and a capacitor Cfb1 that are formed between an output terminal and an inverting terminal of the operational amplifier OPA1. The common voltage Vcm is connected to a non-inverting terminal of the operational amplifier OPA1. Electrical charges are supplied to the capacitor Cfb1 through the capacitor Cm according to on/off operations of the switch SW_r1 and the switch SW_r3. The switch SW_r3 is connected in parallel to the capacitor Cfb1. When the switch SW_r3 is turned on, the operational amplifier OPA1 may be reset.

The second integration circuit unit may include an operational amplifier OPA2 connected to a second node of the switch SW_r2, and a switch SW_r4 and a capacitor Cfb2 that are formed between an output terminal and an inverting terminal of the operational amplifier OPA2. The common voltage Vcm may be connected to a non-inverting terminal of the operational amplifier OPA2. The capacitor Cfb2 may be charged or with electrical charges from the capacitor Cm or discharge the electrical charges, according to operations of the switch SW_r2 and the switch SW_r4. The switch SW_r4 is connected to the capacitor Cfb2 in parallel. When the switch SW_r4 is turned on, the operational amplifier OPA2 may be reset.

An output voltage Vb1 of the operational amplifier OPA1 included in the first integration circuit unit and an output voltage Vb2 of the operational amplifier OPA2 included in the second integration circuit unit may be input to an inverting terminal and a non-inverting terminal of the operational amplifier OPA3, respectively. The operational amplifier OPA3 may calculate and output a difference between the output voltages Vb1 and Vb2 that are respectively received from the inverting terminal and the non-inverting terminal thereof. A first node of the capacitor Cm may be connected to an output terminal of the operational amplifier OPA3. The capacitor Cm may be charged or discharged according to an output voltage of the operational amplifier OPA3.

The third integration circuit unit 320 may include a switch SW-r5, a switch SW-r6, an operational amplifier OPA4, and a capacitor Cfb.

First nodes of the switch SW-r5 and the switch SW-r6 may be connected to a second node of the capacitor Cm, a second node of the switch SW-r5 may be connected to the common voltage, and a second node of the switch SW-r6 may be connected to a non-inverting terminal of an operational amplifier OPA4. Electrical charges may be supplied to the capacitor Cfb through the capacitor Cm according to on/off operations of the switch SW-r5 and the switch SW-r6. The operational amplifier OPA4 may output a voltage Vout corresponding to the amount of the electrical charges supplied to the capacitor Cfb. Hereinafter, a detailed operation of the circuit units according to operations of a plurality of switches will be described with reference to FIGS. 4 and 5.

Figure 4:
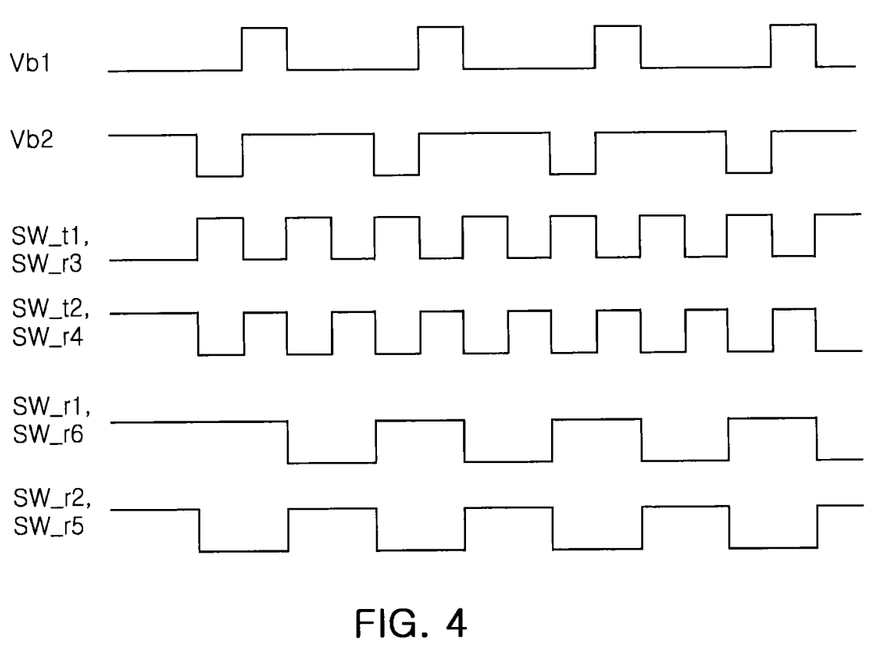
FIGS. 4, 5A, and 5B are diagrams illustrating an operation of the capacitance sensing apparatus according to the embodiment of the present invention.

FIG. 4 is a diagram illustrating on/off operations of a plurality of switches and output voltages Vb1 and Vb2 according thereto, according to the embodiment of the present invention.

Referring to FIG. 4, the switches SW_t1, SW_r3, SW_t2, and SW_r4 operate at the same cycle that will be referred to as a first cycle. In addition, the switch SW_r1, SW_r6, SW_r2, and SW_r5 operate at the same cycle that will be referred to as a second cycle. The first cycle and the second cycle are different from each other. Although the switches SW_t1, SW_r3, SW_t2, and SW_r4 operate at the same cycle, the switches SW_t1 and SW_r3, and the switches SW_t2, and SW_r4 may operate at different turn-on timings such that, when the switches SW_t1 and SW_r3 are turned on, the switches SW_t2 and SW_r4 may be turned off. The switches SW_r1 and SW_r6, and the switches SW_r2 and SW_r5 may also operate at different turn-on timings.

When the switches SW_t1 and SW_r3 are turned on, switches SW_t2 and SW_r4 are turned off, the switches SW_r1 and SW_r6 are turned on, and the switches SW_r2 and SW_r5 are turned off, a driving voltage VCC is applied to the capacitor Cm, such that the capacitor Cm is charged. In this case, since the switch SW_r3 is turned on, the operational amplifier OPA1 is reset so that the output voltage Vb1 of the operational amplifier OPA1 is maintained at the same level.

When the switches SW_t1 and SW_r3 are turn off, the switches SW_t2 and SW_r4 are turned on, the switches SW_r1 and SW_r6 are turned on, and the switches SW_r2 and SW_r5 are turned off, the electrical charges from the capacitor Cm are supplied to the capacitor Cfb1 and the operational amplifier OPA1 may output a high level of the output voltage Vb1.

When the switches SW_t1 and SW_r3 are turned on, the switches SW_t2 and SW_r4 are turned off, the switches SW_r1 and SW_r6 are turned off, and the switches SW_r2 and SW_r5 are turned on, since the switch SW_r3 is turned on, the operational amplifier OPA1 is reset so that the output voltage Vb1 of the operational amplifier OPA1 is maintained at the same level. In addition, a current flowing through the capacitor Cm is output as the output voltage Vb2 of the operational amplifier OPA2, which has a negative potential, through the capacitor Cfb2.

That is, as shown in FIG. 4, in the capacitance sensing apparatus according to the embodiment of the present invention, the switches SW_t1 and SW_t2 included in the driving circuit unit and the switches SW_r1 and SW_r2 included in the buffer end may operate at different cycles such that respective output voltages of the operational amplifiers OPA1 and OPA2 may have positive and negative values based on the common voltage, and the switches SW_r3 and SW_r4 for resetting the operational amplifiers OPA1 and OPA2 may operate at the same cycle as that of the switches SW_t1 and SW_t2 included in the driving circuit unit such that output voltages of the operational amplifiers OPA1 and OPA2 may be output in a similar manner to the case of a general clock signal. In FIG. 4, when the operational amplifier OPA3 may calculate and output the difference between the output voltages Vb1 and Vb2, the output of the operational amplifier OPA3 may correspond to a signal having the second cycle. That is, a voltage applied to the capacitor Cm through the buffer end may be stably maintained, such that a final integrator output that is not sensitive to changes in a capacitor and a resistor may be obtained.

Figure 5A:
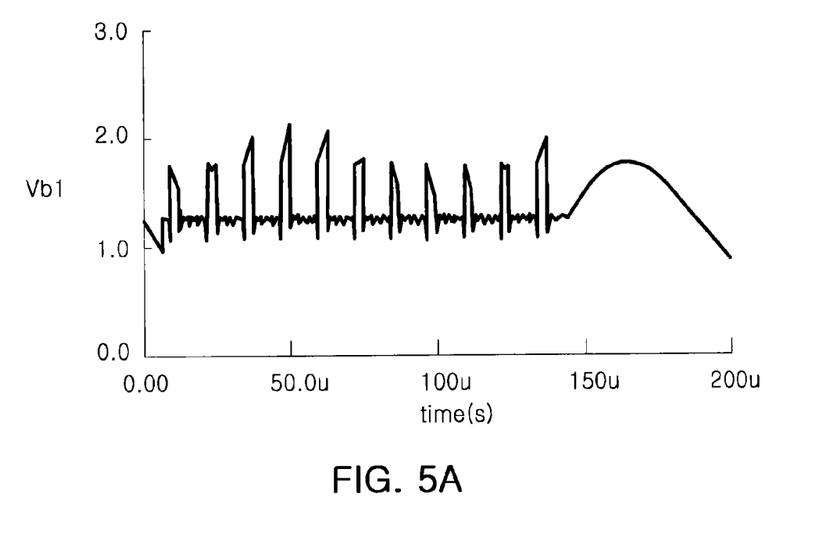
Figure 5B:
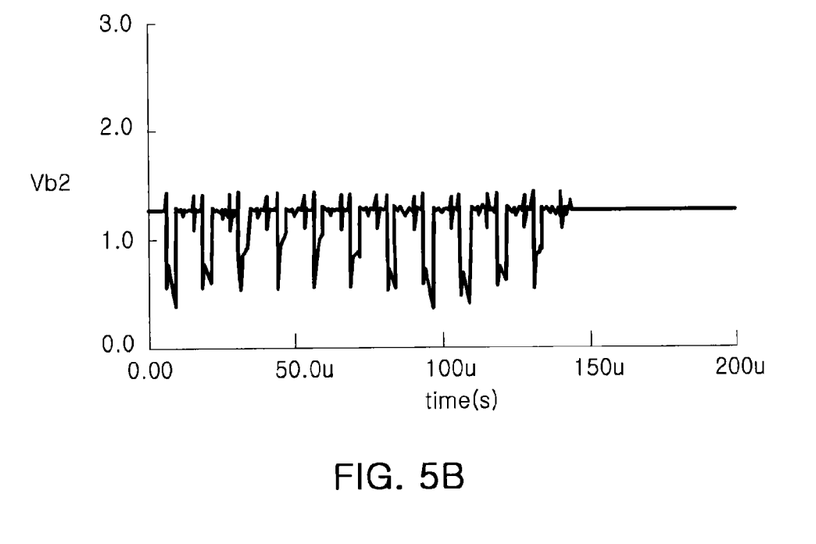

FIG. 5A is a graph showing the output voltage Vb1 of the operational amplifier OPA1 in the case of the introduction of noise, and FIG. 5B is a graph showing the output voltage Vb2 of the operational amplifier OPA2 in the case of the introduction of noise, according to the embodiment of the present invention. Referring to FIGS. 5A and 5B, it may be confirmed that the output voltages Vb1 and Vb2 of the operational amplifier OPA1 and the operational amplifier OPA2 are output to have positive and negative values based on the common voltage (about 1.2 V), respectively, and thus, signals due to the noise is offset.

Figure 6:
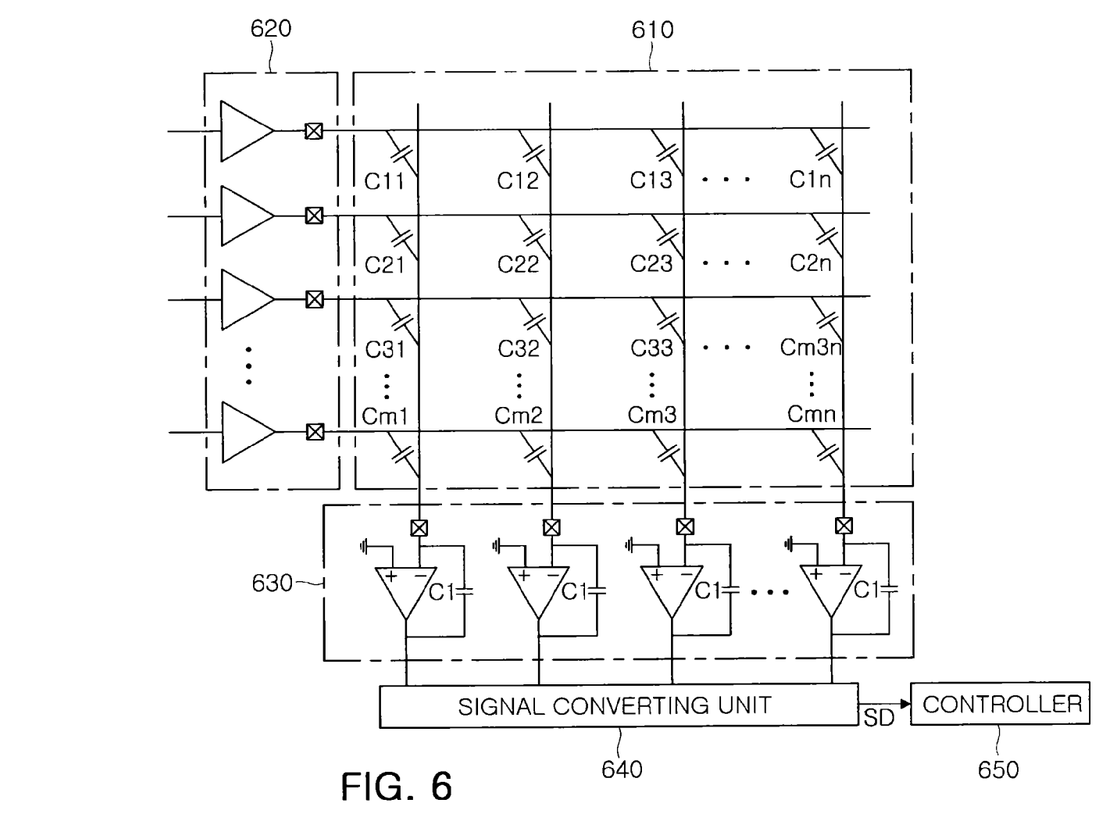
FIG. 6 is a diagram of a touch screen apparatus including a capacitance sensing apparatus according to an embodiment of the present invention.

FIG. 6 is a diagram of a touch screen apparatus including a capacitance sensing apparatus according to an embodiment of the present invention.

Referring to FIG. 6, the touch screen apparatus according to the embodiment includes a panel unit 610, a driving circuit unit 620, a sensing circuit unit 630, a signal converting unit 640, and a controller 650. The panel unit 610 includes a plurality of first electrodes extending in a first axis direction (a horizontal direction in FIG. 5) and a plurality of second electrodes extending in a second axis direction (a vertical direction in FIG. 5) that crosses the first axis direction. Changes in capacitance C11 to Cmn are generated in intersections between the first electrodes and the second electrodes. The changes in capacitance C11 to Cmn generated in the intersections between the first electrodes and the second electrodes may be changes in mutual-capacitance generated by driving signals that are applied to the first electrodes from the driving circuit unit 620. The driving circuit unit 620, the sensing circuit unit 630, the signal converting unit 640, and the controller 650 may be realized as a single integrated circuit (IC).

The driving circuit unit 620 may apply predetermined driving signals to the first electrodes of the panel unit 610. The driving signals may include a square wave signal, a sine wave signal, a triangle wave signal, and the like, which have a predetermined cycle and amplitude, and may be sequentially applied to the first electrodes. FIG. 6 illustrates that circuits for applying driving signals are individually connected to the first electrodes. However, alternatively, a single driving signal generating circuit may be provided and driving signals may be applied to the first electrodes by using a switching circuit.

The sensing circuit unit 630 may include an integration circuit for sensing the changes in capacitance C11 to Cmn from the second electrodes. The integration circuit may include at least one operational amplifier and a capacitor C1 having a predetermined capacitance. An inverting input terminal of the at least one operational amplifier is connected to the second electrodes, and thus, the changes in capacitance C11 to Cmn are converted into an analog signal such as a voltage signal or the like to be output. When driving signals are sequentially applied to the first electrodes, since changes in capacitance C11 to Cmn from the second electrodes may be simultaneously detected, the integration circuit may be provided in an amount equal to the number (i.e., m) of second electrodes.

The signal converting unit 640 generates a digital signal $S_D$ from the analog signal generated by the integration circuit. For example, the signal converting unit 640 may include a time-to-digital converter (TDC) circuit for measuring a period of time for which an analog signal output in the form of voltage from the sensing circuit unit 630 reaches a predetermined reference voltage level and converting the period of time into the digital signal $S_D$ or an analog-to-digital converter (ADC) circuit for measuring an amount by which a level of the analog signal output from the sensing circuit unit 630 is changed for a predetermined period of time and converting the amount into the digital signal $S_D$. The controller 650 determines a touch input applied to the panel unit 610 by using the digital signal $S_D$. For example, the controller 650 may determine the number of touch inputs applied to the panel unit 610, coordinates of the touch input, a gesture based on the touch input, or the like Comparing the capacitance sensing apparatuses of FIGS. 2 and 3 with the touch screen apparatus of FIG. 6, the changes in capacitance C11 to Cmn generated in the intersections between the first electrodes and the second electrodes may correspond to the capacitor Cm of FIGS. 2 and 3. In addition, the driving circuit unit 620 of FIG. 6 may correspond to each of the driving circuit units 240 and 330 of FIGS. 2 and 3, and the sensing circuit unit 630 of FIG. 5 may include the first integration circuit unit 210, the second integration circuit unit 220, the buffer end 310, and the third integration circuit units 230 and 320 of FIGS. 2 and 3.

As set forth above, according to embodiments of the present invention, a switch included in a driving circuit unit and a switch included in a buffer end may operate at different cycles, and respective output voltages of a first integration circuit unit and a second integration circuit unit included in the buffer end may have positive and negative potentials based on a common voltage, thereby offsetting and removing introduced noise.

While the present invention has been shown and described in connection with the embodiments, it will be apparent to those skilled in the art that modifications and variations can be made without departing from the spirit and scope of the invention as defined by the appended claims.

What is claimed is:

1. A capacitance sensing apparatus, comprising:
   a driving circuit unit applying a driving signal having a predetermined cycle to a first capacitor; and
   a sensing circuit unit sensing a change in capacitance generated in the first capacitor based on the driving signal, and comprising:
      a first switch connected to an inverting terminal of a first operational amplifier,
      a second switch connected to an inverting terminal of a second operational amplifier,
      a third switch formed between an output terminal and the inverting terminal of the first operational amplifier,
      a fourth switch formed between an output terminal and the inverting terminal of the second operational amplifier,
   wherein the third switch and the fourth switch operate at a first cycle, the same as the cycle of the driving signal, and the first switch and second switch operate at a second cycle, different from the first cycle, and
   wherein the third switch and the fourth switch operate at different turn-on timings.

2. The capacitance sensing apparatus of claim 1, wherein the first switch and the second switch operate at different turn-on timings.

3. A capacitance sensing apparatus, comprising:
   a driving circuit unit applying a driving signal having a predetermined cycle to a first capacitor; and
   a sensing circuit unit sensing a change in capacitance generated in the first capacitor based on the driving signal,
   wherein a portion of a plurality of switches included in the sensing circuit unit operate at a first cycle, the same as the cycle of the driving signal, and remaining switches among the plurality of switches operate at a second cycle, different from the first cycle,
   wherein the sensing circuit unit includes:
      a first operational amplifier having an inverting terminal connected to a first switch; and
      a second operational amplifier having an inverting terminal connected to a second switch, and
      the first switch and the second switch operate at the second cycle and operate at different turn-on timings, and
   wherein the sensing circuit unit includes a third operational amplifier having an inverting terminal connected to an output terminal of the first operational amplifier and a non-inverting terminal connected to an output terminal of the second operational amplifier.

4. The capacitance sensing apparatus of claim 3, wherein the sensing circuit unit includes a fourth operational amplifier, and fifth and sixth switches formed between an output terminal of the third operational amplifier and an inverting terminal of the fourth operational amplifier, and
   the fifth and sixth switches operate at the second cycle and operate at different turn-on timings.

5. The capacitance sensing apparatus of claim 4, wherein the sensing circuit unit includes a second capacitor formed between the third operational amplifier and the fifth and sixth switches, and
   the second capacitor is charged and discharged according to an output voltage of the third operational amplifier.

6. The capacitance sensing apparatus of claim 1, wherein the second cycle is twice as long as the first cycle.

7. A touch screen apparatus, comprising:
   a panel unit including a plurality of driving electrodes and a plurality of sensing electrodes;
   a driving circuit unit applying driving signals to the plurality of driving electrodes, respectively;
   a sensing circuit unit sensing changes in capacitance generated in intersections between the plurality of sensing electrodes and the driving electrodes to which the driving signals are applied and comprising:
      a first switch connected to an inverting terminal of a first operational amplifier,
      a second switch connected to an inverting terminal of a second operational amplifier,
      a third switch formed between an output terminal and the inverting terminal of the first operational amplifier,
      a fourth switch formed between an output terminal and the inverting terminal of the second operational amplifier; and
   a controller controlling operations of the driving circuit unit and the sensing circuit unit,
   wherein the third switch and the fourth switch operate at a first cycle, the same as the cycle of the driving signals, and the first switch and second switch operate at a second cycle, different from the first cycle, and
   wherein the third switch and the fourth switch operate at different turn-on timings.

8. The touch screen apparatus of claim 7, wherein the controller determines at least one of coordinates of a touch input applied to the panel unit, a gesture based on the touch input, and the number of touch inputs in which the touch input is provided, from an output signal of the sensing circuit unit.

9. The touch screen apparatus of claim 7, wherein the first switch and the second switch operate at different turn-on timings.

10. The touch screen apparatus of claim 7, wherein the sensing circuit unit includes a third operational amplifier calculating and outputting a difference between an output voltage of the first operational amplifier and an output voltage of the second operational amplifier.

11. The touch screen apparatus of claim 10, wherein the sensing circuit unit includes a fourth operational amplifier, and fifth and sixth switches formed between an output terminal of the third operational amplifier and an inverting terminal of the fourth operational amplifier, and
    the fifth and sixth switches operate at the second cycle and operate at different turn-on timings.

12. The touch screen apparatus of claim 7, wherein the first cycle is a cycle equal to a half of the second cycle.

* * * * *